(12) United States Patent
Kreupl et al.

(10) Patent No.: US 8,686,419 B2
(45) Date of Patent: Apr. 1, 2014

(54) STRUCTURE AND FABRICATION METHOD FOR RESISTANCE-CHANGE MEMORY CELL IN 3-D MEMORY

(75) Inventors: Franz Kreupl, Mountain View, CA (US); Deepak C Sekar, San Jose, CA (US)

(73) Assignee: SanDisk 3D LLC, Milpitas, CA (US)

(*) Notice: Subject to any disclaimer, the term of this patent is extended or adjusted under 35 U.S.C. 154(b) by 241 days.

(21) Appl. No.: 13/029,361

(22) Filed: Feb. 17, 2011

(65) Prior Publication Data

US 2011/0204316 A1 Aug. 25, 2011

Related U.S. Application Data

(60) Provisional application No. 61/307,398, filed on Feb. 23, 2010.

(51) Int. Cl.
*H01L 45/00* (2006.01)

(52) U.S. Cl.
USPC ......... 257/50; 257/74; 257/E45.003; 438/382

(58) Field of Classification Search
USPC ......... 257/4–5, 43, 50, 73–74, 248, 622, 623, 257/E45.003, E45.002; 365/148, 163; 438/382
See application file for complete search history.

(56) References Cited

U.S. PATENT DOCUMENTS

| | | | |
|---|---|---|---|
| 5,298,437 A * | 3/1994 | McFarlane et al. | ........... 438/328 |
| 5,915,167 A | 6/1999 | Leedy | |
| 6,034,882 A | 3/2000 | Johnson et al. | |
| 6,420,215 B1 | 7/2002 | Knall et al. | |
| 6,525,953 B1 | 2/2003 | Johnson | |
| 6,951,780 B1 | 10/2005 | Herner | |
| 6,952,030 B2 | 10/2005 | Herner et al. | |
| 6,952,043 B2 | 10/2005 | Vyvoda et al. | |
| 7,081,377 B2 | 7/2006 | Cleeves | |
| 7,176,064 B2 | 2/2007 | Herner | |
| 7,586,773 B2 | 9/2009 | Herner | |
| 2006/0087005 A1 | 4/2006 | Herner et al. | |
| 2006/0250836 A1 | 11/2006 | Herner et al. | |
| 2006/0250837 A1 | 11/2006 | Herner et al. | |
| 2007/0243718 A1* | 10/2007 | Shiratori et al. | ............. 438/758 |
| 2009/0001343 A1 | 1/2009 | Schricker et al. | |
| 2009/0032795 A1* | 2/2009 | Kim et al. | ......... 257/4 |
| 2009/0316467 A1 | 12/2009 | Liu | |

FOREIGN PATENT DOCUMENTS

EP 1096500 A1 5/2001

OTHER PUBLICATIONS

International Search Report & The Written Opinion of the International Searching Authority dated Jul. 5, 2011, International Application No. PCT/US2011/025768.

(Continued)

*Primary Examiner* — Tucker Wright
(74) *Attorney, Agent, or Firm* — Vierra Magen Marcus LLP

(57) ABSTRACT

A memory device in a 3-D read and write memory includes a resistance-changing layer, and a local contact resistance in series with, and local to, the resistance-changing layer. The local contact resistance is established by a junction between a semiconductor layer and a metal layer. Further, the local contact resistance has a specified level of resistance according to a doping concentration of the semiconductor and a barrier height of the junction. A method for fabricating such a memory device is also presented.

19 Claims, 17 Drawing Sheets

(56) References Cited

OTHER PUBLICATIONS

Dimitriadis, C.A., et al., "Schottky barrier contacts of titanium nitride on n-type silicon," Applied Physics Letters, AIP, American Institute of Physics, vol. 66, No. 4, Jan. 23, 1995, 3 pages.

Singh, "Metal-Semiconductor Junctions," printed from http://www.eecs.umich.edu/~sing/semi.html on Feb. 16, 2010, 9 pages.

Sze, "Physics of Semiconductor Devices," 3rd Ed., Wiley-Interscience, Oct. 2006, pp. 187-191.

Pagnia, et al., "Bistable Switching in Electroformed Metal-Insulator-Metal Devices," Phys. Stat. Sol. (A), vol. 108, Issue 1, Jul. 1998, pp. 11-65.

International Preliminary Report on Patentability dated Aug. 28, 2012, International Application No. PCT/US2011/025768.

* cited by examiner

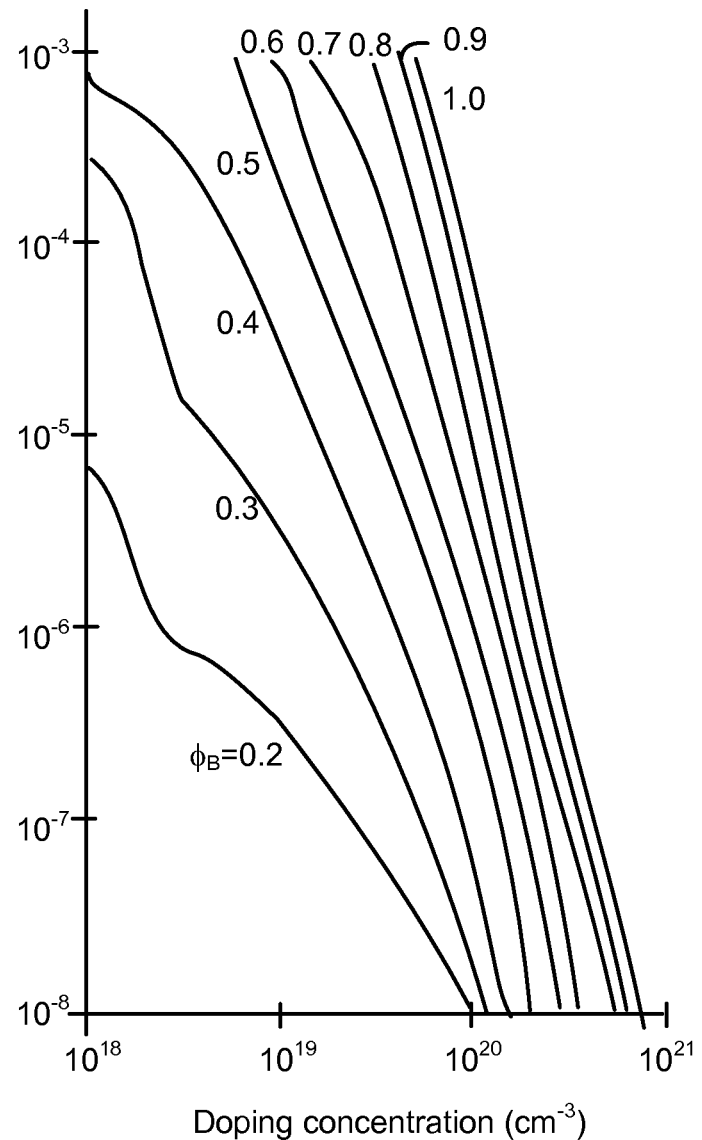

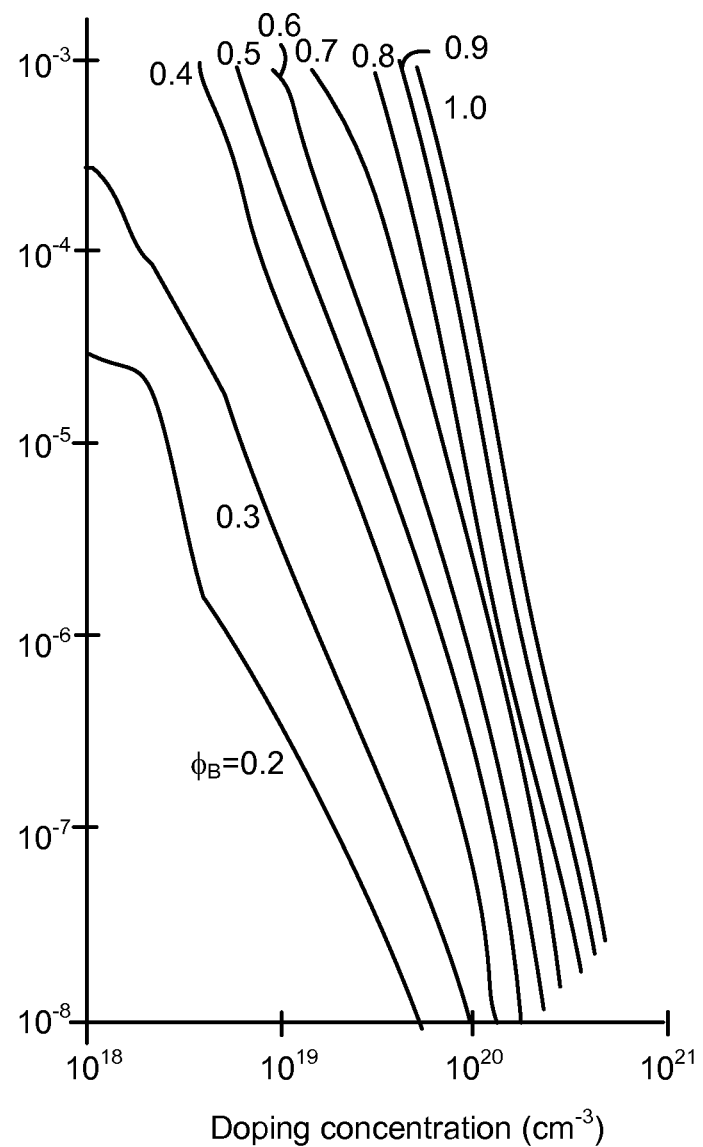

Fig. 10c

| n-type Semiconductor | Metal |
|---|---|
| n-Ge | Ag-Al-Sb, Al, Al-Au-P, Au, Bi, Sb, Sn, Pb-Sn |
| n-Si | Ag, Al, Al-Au, Ni, Sn, In, Ge-Sn, Sb, Au-Sb, Ti, TiN |
| n-GaAs | Au(.88)Ge(.12)-Ni, Ag-Sn, Ag(.95)In(.05)-Ge |
| n-GaP | Ag-Te-Ni, Al, Au-Si, Au-Sn, In-Sn |
| n-GaAsP | Au-Sn |
| n-GaAlAs | Au-Ge-Ni |
| n-InAs | Au-Ge, Au-Sn-Ni, Sn |
| n-InGaAs | Au-Ge, Ni |
| n-InP | Au-Ge, In, Ni, Sn |
| n-InSb | Au-Sn, Au-In, Ni, Sn |
| n-CdS | Ag, Al, Au, Au-In, Ga, In, Ga-In |

| p-type Semiconductor | Metal |
|---|---|
| p-Ge | Ag, Al, Au, Cu, Ga, Ga-In, In, Al-Pd, Ni, Pt, Sn |
| p-Si | Ag, Al, Al-Au, Au, Ni, Pt, Sn, In, Pb, Ga, Ge, Ti, TiN |
| p-GaAs | Au(.84)Zn(.16), Ag-In-Zn, Ag-Zn |
| p-GaP | Au-In, Au-Zn, Ga, In-Zn, Zn, Ag-Zn |
| p-GaAsP | Au-Zn |
| p-GaAlAs | Au-Zn |
| p-InAs | Al |
| p-InGaAs | Au-Zn, Ni |
| p-InSb | Au-Ge |
| n-CdTe | In p-CdTe Au, In-Ni, Indalloy 13, Pt, Rh |
| n-ZnSe | In, In-Ga, Pt, InHg |
| n-SiC | W p-SiC Al-Si, Si, Ni |

Fig. 10d

Work function $\Phi_M$

| Element | Work function $\Phi_M$ (Volts) |
|---|---|
| Ag, silver | 4.26 |
| Al, aluminum | 4.28 |
| Au, gold | 5.1 |
| Cr, chromium | 4.5 |
| Mo, molybdenum | 4.6 |
| Ni, nickel | 5.15 |
| Pd, palladium | 5.12 |
| Pt, platinum | 5.65 |
| Ti, titanium | 4.33 |
| W, tungsten | 4.55 |

Fig. 10e

Barrier height $\phi_B$ in eV

| Metal | n-Si | p-Si | n-GaAs |
|---|---|---|---|
| Al | 0.7 | 0.8 | |
| Ti | 0.5 | 0.61 | |
| W | 0.67 | | |
| Au | 0.79 | 0.25 | 0.9 |
| Ag | | | 0.88 |
| Pt | | | 0.86 |
| PtSi | 0.85 | 0.2 | |
| NiSi$_2$ | 0.7 | 0.45 | |

Fig. 10f

Electron affinity $\chi$

| Element | Electron affinity, $\chi$ (Volts) |
|---|---|
| Ge, germanium | 4.13 |
| Si, silicon | 4.01 |
| GaAs, gallium arsenide | 4.07 |
| AlAs, aluminum arsenide | 3.5 |

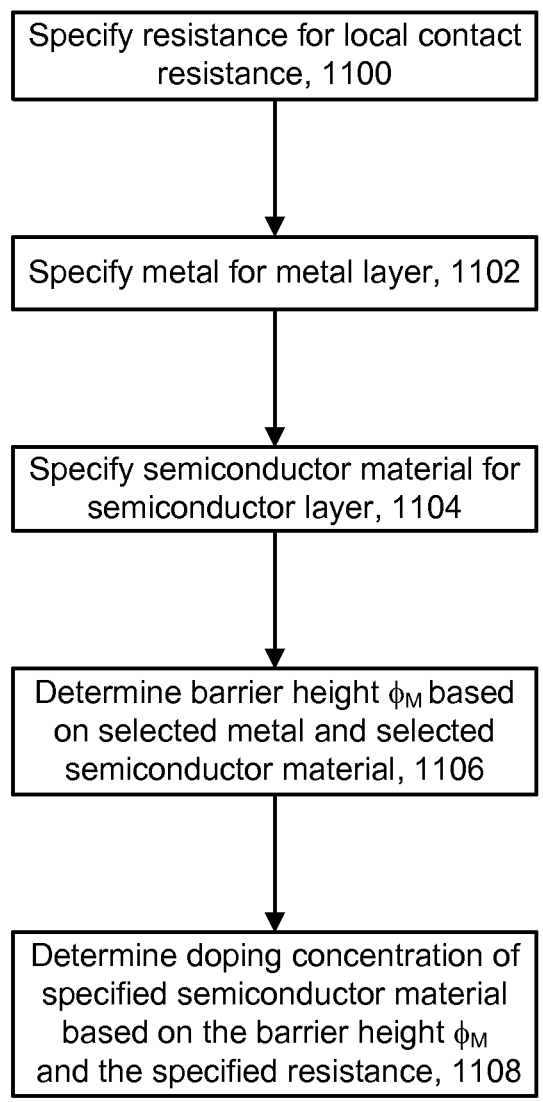

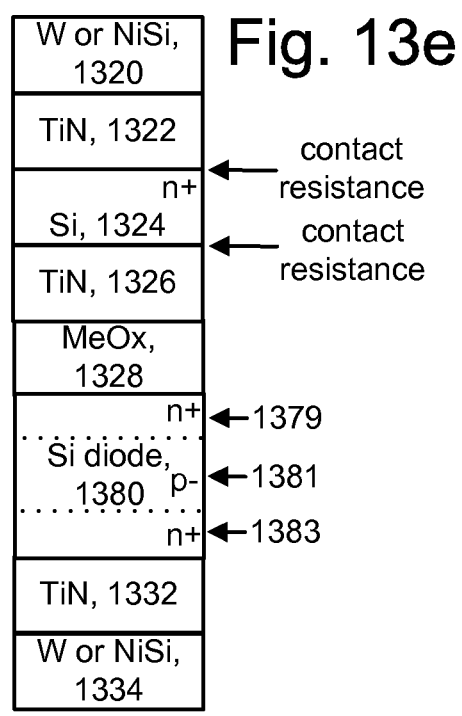

STRUCTURE AND FABRICATION METHOD FOR RESISTANCE-CHANGE MEMORY CELL IN 3-D MEMORY

CROSS-REFERENCE TO RELATED APPLICATIONS

This application claims the benefit of U.S. provisional patent application No. 61/307,398, filed Feb. 23, 2010, and incorporated herein by reference.

BACKGROUND

The present invention relates to technology for data storage.

A variety of materials show reversible resistance-change behavior. These materials include chalcogenides, carbon polymers, perovskites, and certain metal oxides (MeOx) and nitrides. Specifically, there are metal oxides and nitrides which include only one metal and exhibit reliable resistance switching behavior. This group includes, for example, Nickel Oxide (NiO), Niobium Oxide ($Nb_2O_5$), Titanium Dioxide ($TiO_2$), Hafnium Oxide ($HfO_2$) Aluminum Oxide ($Al_2O_3$), Magnesium Oxide ($MgO_x$), Chromium Dioxide ($CrO_2$), Vanadium Oxide (VO), Boron Nitride (BN), and Aluminum Nitride (AlN), as described by Pagnia and Sotnick in "Bistable Switching in Electroformed Metal-Insulator-Metal Device," Phys. Stat. Sol. (A) 108, 11-65 (1988). A resistance-changing layer of one of these materials may be formed in an initial state, for example a relatively low-resistance state. Upon application of sufficient voltage, the material switches to a stable high-resistance state. This resistance switching is reversible such that subsequent application of an appropriate current or voltage can serve to return the resistance-change material to a stable low-resistance state. This conversion can be repeated many times. For some materials, the initial state is high-resistance rather than low-resistance. A set process may refer to switching the material from high to low resistance, while a reset process may refer to switching the material from low to high resistance.

These reversible resistance-change materials are of interest for use in nonvolatile memory arrays. One resistance state may correspond to a data "0," for example, while the other resistance state corresponds to a data "1." Some of these materials may have more than two stable resistance states.

Non-volatile memories that have storage elements or cells formed from reversible resistance-change material are known. For example, U.S. Patent Application Publication 2006/0250836, filed May 9, 2005 and titled "Rewriteable Memory Cell Comprising A Diode And A Resistance-Switching Material," incorporated herein by reference, describes a rewriteable non-volatile memory cell that includes a diode coupled in series with a reversible resistance-change material such as a metal oxide or metal nitride.

There is a continuing need to improve write speed in these and other memory devices. Typically, a higher voltage can be applied to reduce the set time of a memory cell. However, it can be more difficult to reset a memory cell which has been programmed using a high voltage.

BRIEF DESCRIPTION OF THE DRAWINGS

FIG. 8a depicts a cell voltage during the set process of FIG. 5a, based on the circuit of FIG. 7a.

FIG. 8b depicts a cell current during the set process of FIG. 5a, based on the circuit of FIG. 7a.

FIG. 8c depicts a cell resistance during the set process of FIG. 5a, based on the circuit of FIG. 7a.

FIG. 8d depicts a cell voltage during the set process of FIG. 5a, based on the circuits of FIG. 7b-7e and based on a high amplitude programming voltage as depicted by waveform 800 in FIG. 8a.

FIG. 8e depicts a cell voltage during the set process of FIG. 5a, based on the circuits of FIG. 7b-7e and based on a low amplitude programming voltage as depicted by waveform 802 in FIG. 8a.

FIG. 10a depicts a relationship between contact resistance and doping concentration for an n-type semiconductor, for different barrier heights, for use in forming a local contact resistance such as described in the circuits of FIGS. 7b-7e.

FIG. 10b depicts a relationship between contact resistance and doping concentration for a p-type semiconductor, for different barrier heights, for use in forming a local contact resistance such as described in the circuits of FIGS. 7b-7e.

FIG. 10c depicts a table of example combinations of semiconductors and metals, arranged by n-type and p-type semiconductors.

FIG. 10d depicts a table of metals and associated representative work functions.

FIG. 10e depicts a table of example barrier heights for metals and associated semiconductors.

FIG. 10f depicts a table of example electron affinities for semiconductors.

FIG. 11 depicts an example method for specifying a design of a memory device.

FIG. 13e depicts an example implementation of a layered memory device corresponding to FIG. 12f, where a punch-through diode is used as a steering element.

DETAILED DESCRIPTION

A memory device in a 3-D read and write memory includes a resistance-changing layer, and a local contact resistance in series with, and local to, the resistance-changing layer. The local contact resistance is established by a junction between a semiconductor layer and a metal layer. Further, the local contact resistance has a specified level of resistance according to a doping concentration of the semiconductor and a barrier height of the junction. A method for fabricating such a memory device is also presented.

Figure 1:
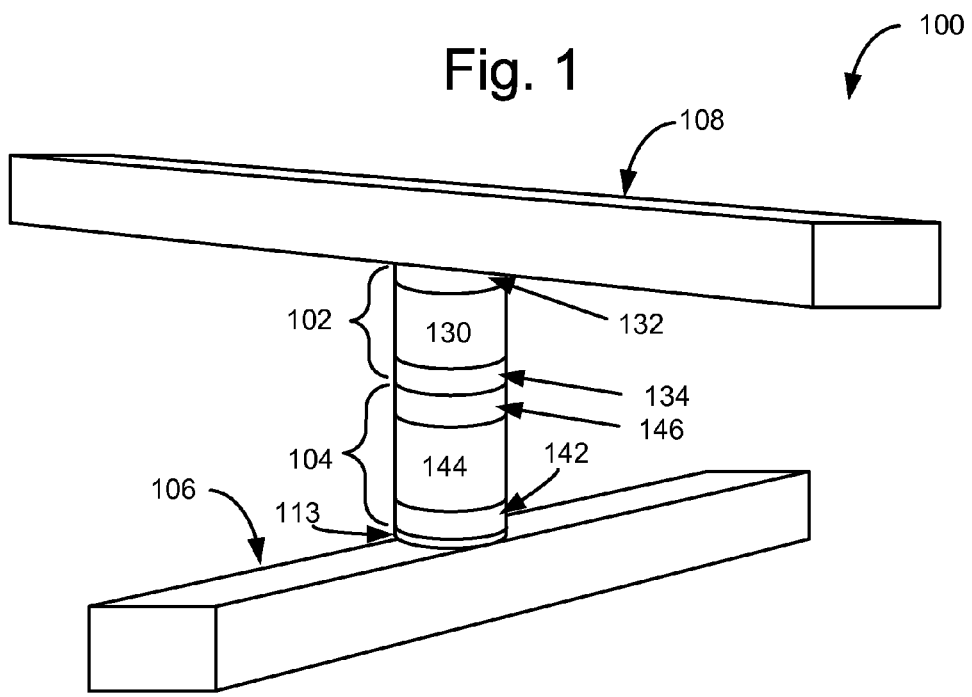
FIG. 1 is a simplified perspective view of one embodiment of a memory cell with a reversible resistance-change element.

FIG. 1 is a simplified perspective view of one embodiment of a memory cell 100 which includes a reversible resistance-change element 102 coupled in series with a steering element 104 between a first conductor 106 and a second conductor 108.

Reversible resistance-change element 102 includes a reversible resistance-changing material or layer 130 having a resistivity that may be reversibly switched between two or more states. For example, the reversible resistance-change material may be in an initial high-resistivity state upon fabrication that is switchable to a low-resistivity state upon application of a first voltage and/or current. Application of a second voltage and/or current may return the reversible resistance-change material to the high-resistivity state. Alternatively, the reversible resistance-change element may be in an initial low-resistance state upon fabrication that is reversibly switchable to a high-resistance state upon application of the appropriate voltage(s) and/or current(s). When used in a memory cell, one resistance state may represent a binary "0" while another resistance state may represent a binary "1." However, more than two data/resistance states may be used. Numerous reversible resistance-change materials and operation of memory cells employing reversible resistance-change materials are described, for example, in the above-mentioned U.S. Patent Application Publication 2006/0250836.

In one embodiment, the process of switching the resistance from the high-resistivity state to the low-resistivity state is referred to as setting the reversible resistance-change element 102. The process of switching the resistance from the low-resistivity state to the high-resistivity state is referred to as resetting the reversible resistance-change element 102. The high-resistivity state is associated with binary data "0" and the low-resistivity state is associated with binary data "1." In other embodiments, setting and resetting and/or the data encoding can be reversed. The set or reset process can be performed for a memory cell to program it to a desired state to represent binary data.

In some embodiments, reversible resistance-change material 130 may be formed from a metal oxide. Various different metal oxides can be used. In one example, hafnium oxide ($HfO_2$) is be used.

More information about fabricating a memory cell using reversible resistance-change material can be found in US 2009/0001343, published Jan. 1, 2009, titled "Memory Cell That Employs a Selectively Deposited Reversible Resistance Switching Element and Methods of Forming The Same," and incorporated herein by reference in its entirety.

Reversible resistance-change element 102 includes electrodes 132 and 134. Electrode 132 is positioned between a reversible resistance-change material 130 (such as metal oxide) and conductor 108. In one embodiment, electrode 132 is made of titanium (Ti). Electrode 134 is positioned between metal oxide reversible resistance-change material 130 and diode 104. In one embodiment, electrode 134 is made of Titanium Nitride (TiN), and serves as a barrier layer.

Steering element 104 can be a diode, or other suitable steering element that exhibits non-ohmic conduction by selectively limiting the voltage across and/or the current flow through the reversible resistance-change element 102. In this manner, the memory cell 100 may be used as part of a two or three dimensional memory array and data may be written to and/or read from the memory cell 100 without affecting the state of other memory cells in the array. Diode 104 may include any suitable diode such as a vertical polycrystalline p-n or p-i-n diode, whether upward pointing with an n-region above a p-region of the diode or downward pointing with a p-region above an n-region of the diode. Or, even a punch-through diode, which is operable in both directions, can be used.

In some embodiments, diode 104 may be formed from a polycrystalline semiconductor material such as polysilicon, a polycrystalline silicon-germanium alloy, polygermanium or any other suitable material. For example, the diode 104 may include a heavily doped n+ polysilicon region 142, a lightly doped or an intrinsic (unintentionally doped) polysilicon region 144 above the n+ polysilicon region 142, and a heavily doped p+ polysilicon region 146 above the intrinsic region 144. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 142 to prevent and/or reduce dopant migration from the n+ polysilicon region 142 into the intrinsic region 144, as described, for example, in U.S. Patent Application Publication No. 2006/0087005, filed Dec. 9, 2005 and titled "Deposited Semiconductor Structure To Minimize N-Type Dopant Diffusion And Method Of Making," incorporated herein by reference. It will be understood that the locations of the n+ and p+ regions may be reversed.

When diode 104 is fabricated from deposited silicon (e.g., amorphous or polycrystalline), a silicide layer may be formed on the diode to place the deposited silicon in a low resistivity state, as fabricated. Such a low resistivity state allows for easier programming of the memory cell as a large voltage is not required to switch the deposited silicon to a low resistivity state.

As described in U.S. Pat. No. 7,176,064, "Memory Cell Comprising a Semiconductor Junction Diode Crystallized Adjacent to a Silicide," incorporated herein by reference, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistivity silicon thereby is provided. Similar results may be achieved for silicon-germanium alloy and/or germanium diodes.

Conductors 106 and 108 include any suitable conductive material such as tungsten, any appropriate metal, heavily doped semiconductor material, a conductive silicide, a conductive silicide-germanide, a conductive germanide, or the like. In the embodiment of FIG. 1, conductors 106 and 108 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 106 and 108 to improve device performance and/or aid in device fabrication.

While the reversible resistance-change element 102 is shown as being positioned above the steering element 104 in FIG. 1, it will be understood that in alternative embodiments, the reversible resistance-change element 102 may be positioned below the steering element 104.

Figure 2A:
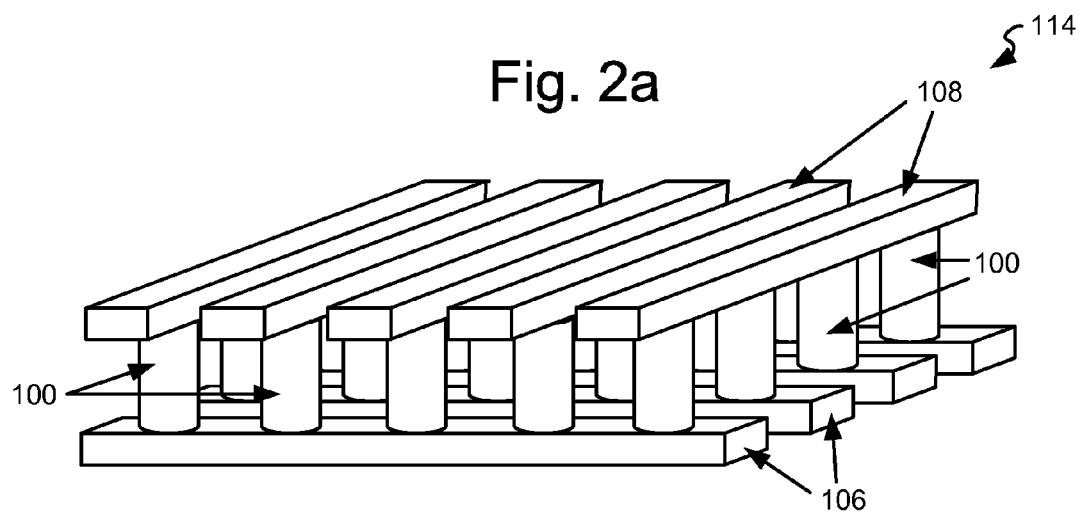
FIG. 2a is a simplified perspective view of a portion of a first memory level formed from a plurality of the memory cells of FIG. 1.

FIG. 2a is a simplified perspective view of a portion of a first memory level 114 formed from a plurality of the memory cells 100 of FIG. 1. For simplicity, the reversible resistance-change element 102, the diode 104, and barrier layer 113 are not separately shown. The memory array 114 is a "cross-point" array including a plurality of bit lines (second conductors 108) and word lines (first conductors 106) to which multiple memory cells are coupled (as shown). Other memory array configurations may be used, as may multiple levels of memory.

Figure 2B:
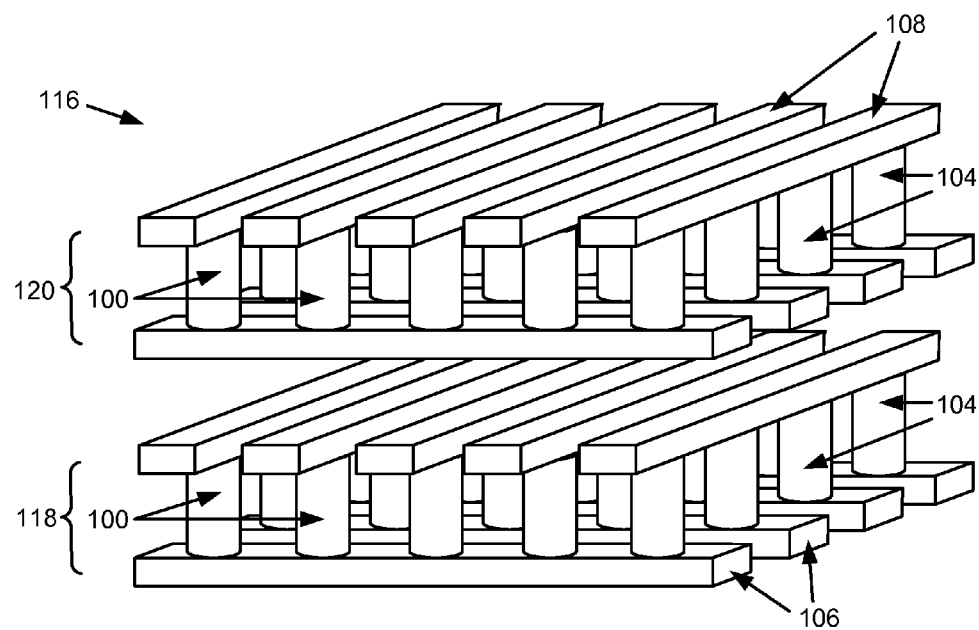
FIG. 2b is a simplified perspective view of a portion of a three dimensional memory array formed from a plurality of the memory cells of FIG. 1.
Figure 3:
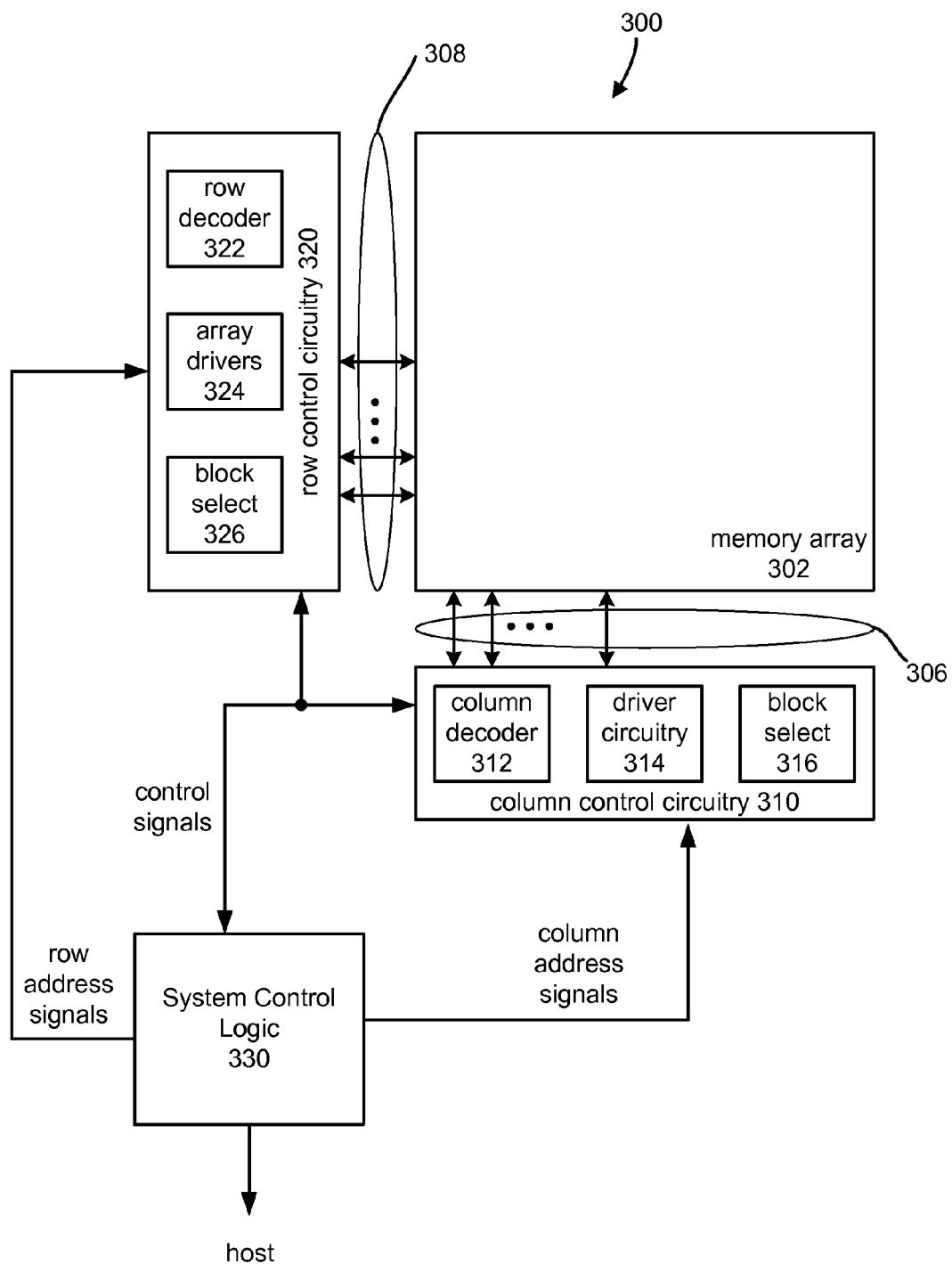
FIG. 3 is a block diagram of one embodiment of a memory system.

FIG. 2b is a simplified perspective view of a portion of a monolithic three dimensional array 116 that includes a first memory level 118 positioned below a second memory level 120. In the embodiment of FIG. 3, each memory level 118 and 120 includes a plurality of memory cells 100 in a cross-point array. It will be understood that additional layers (e.g., an inter-level dielectric) may be present between the first and second memory levels 118 and 120, but are not shown in FIG. 2b for simplicity. Other memory array configurations may be used, as may additional levels of memory. In the embodiment of FIG. 2b, all diodes may "point" in the same direction, such as upward or downward depending on whether p-i-n diodes having a p-doped region on the bottom or top of the diode are employed, simplifying diode fabrication.

Figure 2C:
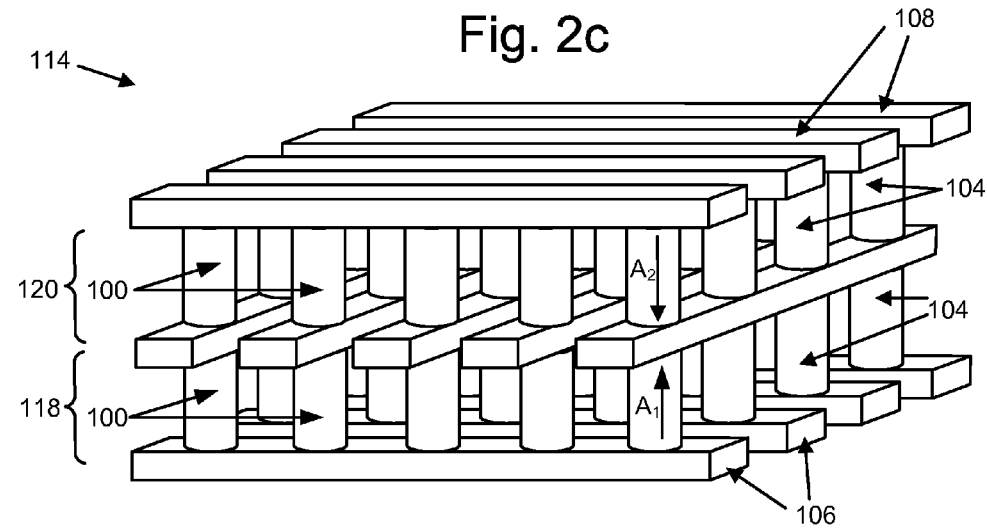
FIG. 2c is a simplified perspective view of a portion of a three dimensional memory array formed from a plurality of the memory cells of FIG. 1.

In some embodiments, the memory levels may be formed as described in U.S. Pat. No. 6,952,030, "High-Density Three-Dimensional Memory Cell," incorporated herein by reference. For instance, the upper conductors of a first memory level may be used as the lower conductors of a second memory level that is positioned above the first memory level as shown in FIG. 2c. In such embodiments, the diodes on adjacent memory levels preferably point in opposite directions, as described in U.S. Pat. No. 7,586,773, titled "Large Array Of Upward Pointing P-I-N Diodes Having Large And Uniform Current," incorporated herein by reference. For example, the diodes of the first memory level 118 may be upward pointing diodes as indicated by arrow A1 (e.g., with p regions at the bottom of the diodes), while the diodes of the second memory level 120 may be downward pointing diodes as indicated by arrow A2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory," incorporated herein by reference. The substrates may be thinned or removed from the memory levels before bonding, but as the memory levels are initially formed over separate substrates, such memories are not true monolithic three dimensional memory arrays.

The above examples show memory cells in a cylindrical shape and conductors in the shapes of rails according to the disclosed arrangements. However, the technology described herein is not limited to any one specific structure for a memory cell. Other structures can also be used to form memory cells that include reversible resistance-change material. Examples of structures of memory cells that can be adapted to use reversible resistance-change material are provided in: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377, each of which is incorporated herein by reference. Additionally, other types of memory cells can also be used with the inventions described herein.

FIG. 3 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from system control logic circuit 330, and typically may include such circuits as row decoders 322, array terminal drivers 324, and block select circuitry 326 for both read and programming (e.g., set and reset) operations. Memory system 300 also includes column control circuitry 310 whose input/outputs 306 are connected to respective bit lines of the memory array 302. Column control circuitry 306 receives a group of N column address signals and one or more various control signals from system control logic 330, and typically may include such circuits as column decoders 312, array terminal receivers or drivers 314, block select circuitry 316, as well as read/write circuitry, including sense amps 318, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300. For example, write circuitry 460, read circuitry 461 and clamp control circuitry 464, discussed further below, may be provided.

In one embodiment, all of the components depicted in FIG. 3 are arranged on a single integrated circuit. For example, system control logic 330, column control circuitry 310 and row control circuitry 320 can be formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

As described above, reversible resistance-change element 102 may be reversibly switched between two or more states. For example, the reversible resistance-change material may be in an initial, high-resistivity state upon fabrication that is switchable to a low-resistivity state upon application of a first voltage and/or current. Application of a second voltage and/or current may return the reversible resistance-change material to a high-resistivity state.

Figure 5A:
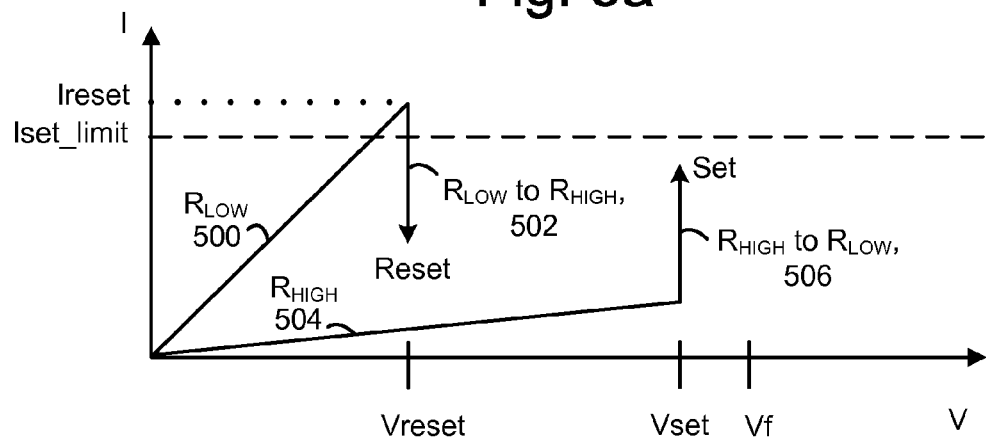
FIG. 5a is a graph depicting I-V characteristics of an example reversible resistance-change element.

FIG. 5a is a graph of voltage versus current for one example embodiment of a reversible resistance-change element. Line 504 represents the I-V characteristics of the reversible resistance-change element when in the high-resistivity state ($R_{HIGH}$), and line 506 represents a transition to a low resistivity state at Vreset. Line 500 represents the I-V characteristics of the reversible resistance-change element when in the low-resistivity state ($R_{LOW}$), and line 502 represents a transition to a high resistivity state at Vset. The example shows a unipolar operation mode where the polarity of the voltage is not changed during switching. In general, the voltages may have different polarities for the "set" and "reset" operation.

To determine which state the reversible resistance-change element is in, a voltage is applied and the resulting current is measured. A higher measured current indicates that the reversible resistance-change element is in the low-resistivity state, while a lower measured current indicates that the reversible resistance-change element is in the high-resistivity state. Note that other variations of a reversible resistance-change element having different I-V characteristics can also be used with the technology herein.

Figure 5B:
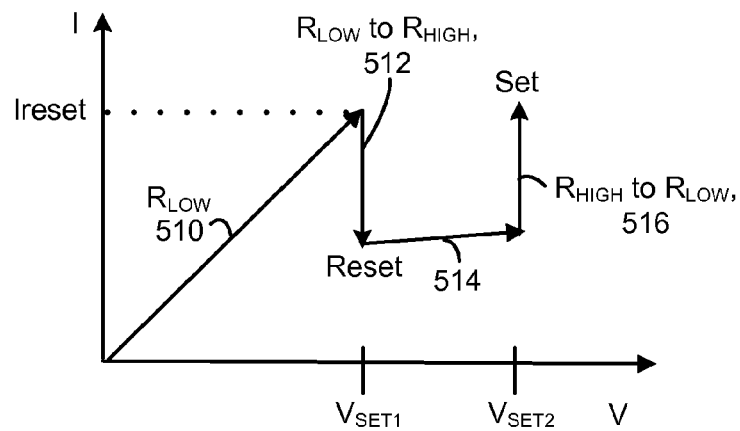
FIG. 5b is a graph depicting I-V characteristics of another example reversible resistance-change element.

For example, FIG. 5b is a graph depicting I-V characteristics of another example reversible resistance-change element. In this case, the element follows a path 510 in a low-resistivity state ($R_{LOW}$), then switches in path 512 to a high resistivity state at a voltage Vset1. As the voltage is increased further, the element follows a path 514 in the high-resistivity state ($R_{HIGH}$), then switches in path 516 to back to the low resistivity state at a voltage Vset2.

Figure 4:
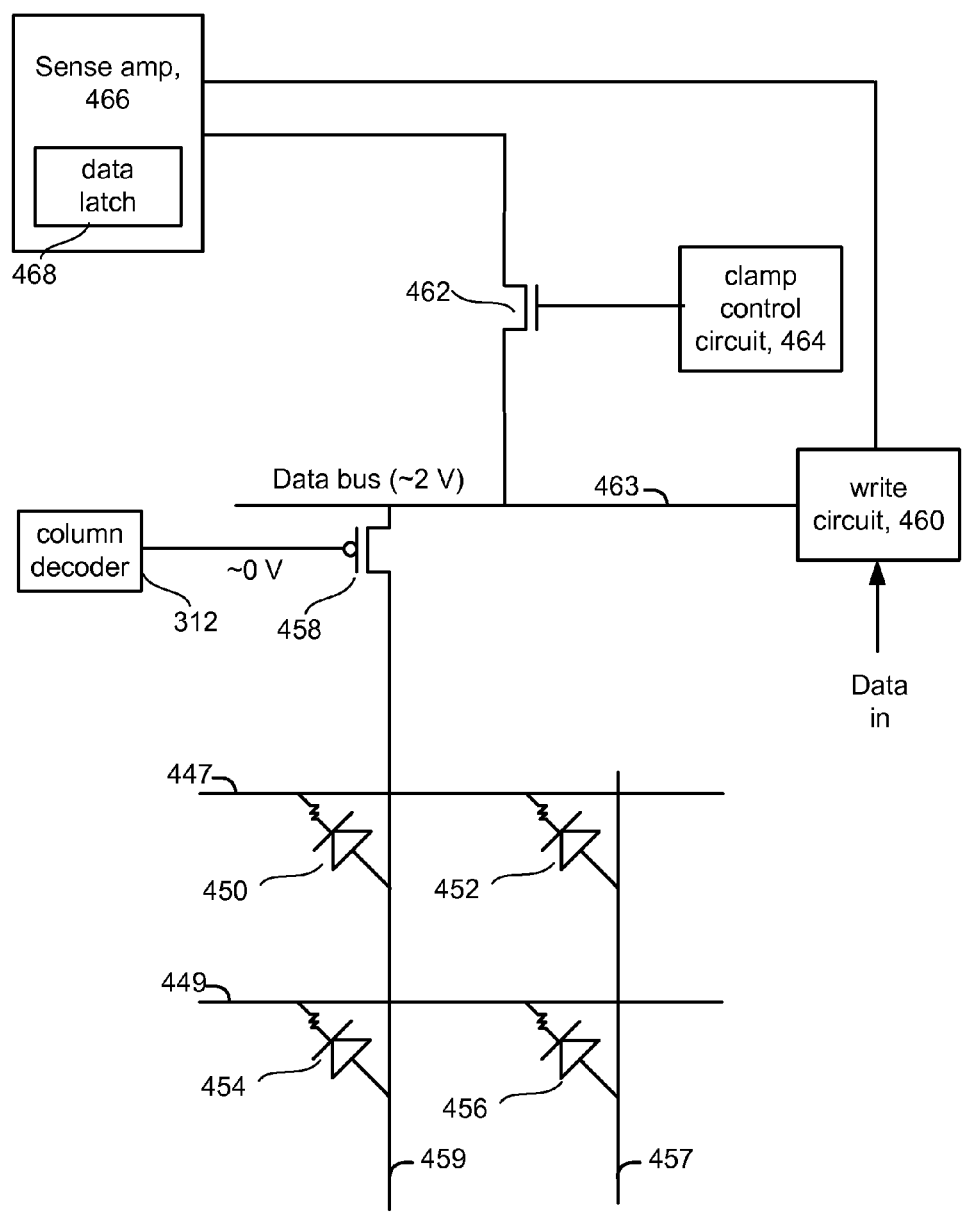
FIG. 4 depicts a circuit for reading the state of a memory cell.

FIG. 4 depicts a circuit that illustrates one embodiment for reading the state of a memory cell. A portion of a memory array includes memory cells 450, 452, 454 and 456. Two of the many bit lines and two of the many word lines are depicted. Bit line 459 is coupled to cells 450 and 454, and bit line 457 is coupled to cells 452 and 456. Bit line 459 is the selected bit line and may be at 2 V, for instance. Bit line 457 is an unselected bit line and may be at ground, for instance. Word line 447 is the selected word line and may be at 0 V, for instance. Word line 449 is an unselected word line and may be at 2 V, for instance.

A read circuit for one of the bit lines 459 is depicted to be connected to the bit line via transistor 458, which is controlled by a gate voltage supplied by column decoder 312 in order to select or unselect the corresponding bit line. Transistor 458 connects the bit line to a Data bus 463. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to a sense amp 466, which includes a data latch 468. The output of sense amp 466 is connected to a data out terminal (to system control logic 330, a controller and/or a host). Write circuit 460 is also connected to the sense amp 466 and the data latch 468.

When attempting to read the state of the reversible resistance-change element, all word lines are first biased at $V_{READ}$ (e.g., approximately 2 V) and all bit lines are at ground. The selected word line is then pulled to ground. For example, this discussion will assume that memory cell 450 is selected for reading. One or more selected bit lines 459 are pulled to $V_{READ}$ through the data bus (by turning on transistor 458) and the clamp device (transistor 462, which receives ~2 V+$V_{TH}$, the threshold voltage of the transistor 462). The clamp device's gate is above $V_{READ}$ but controlled to keep the bit line near $V_{READ}$. In one approach, current is pulled by the selected memory cell 450 through transistor 462 from a sense node in the sense amp. The sense node can receive a reference current that is between a high-resistivity state current and a low-resistivity state current. The sense node moves corresponding to the current difference between the cell current and the reference current. Sense amp 466 generates a data out signal by comparing the sensed voltage to a reference read voltage. If the memory cell current is larger than the reference current, the memory cell is in the low-resistivity state and the voltage at the sense node will be lower than the reference voltage. If the memory cell current is smaller than the reference current, the memory cell is in the high-resistivity state and the voltage at the sense node will be higher than the reference voltage. The output data signal from the sense amp 466 is latched in data latch 468.

Looking back at FIG. 5a, while in the high-resistivity state, if the voltage $V_{SET}$ and sufficient current is applied, the reversible resistance-change element will be set to the low-resistivity state. Line 504 shows the behavior when $V_{SET}$ is applied. The voltage will remain somewhat constant and the current will increase toward $I_{SET\_LIMIT}$. At some point, the reversible resistance-change element will be set and the device behavior will be based on line 506. Note that the first time the reversible resistance-change element is set, Vf (the forming voltage) is needed to set the device. After that, $V_{SET}$ is sufficient to set the device be used. The forming voltage Vf may be greater than $V_{SET}$.

While in the low-resistivity state (line 500), if the voltage $V_{RESET}$ and sufficient current ($I_{RESET}$) are applied, the reversible resistance-change element will be reset to the high-resistivity state. Line 500 shows the behavior when $V_{RESET}$ is applied. At some point, the reversible resistance-change element will be reset and the device behavior will be based on line 502.

In one embodiment, $V_{SET}$ is approximately 5 V, $V_{RESET}$ is approximately 3 V, $I_{SET\_LIMIT}$ is approximately 5 µA and $I_{RESET}$ could be as high as 30 µA.

Figure 6:
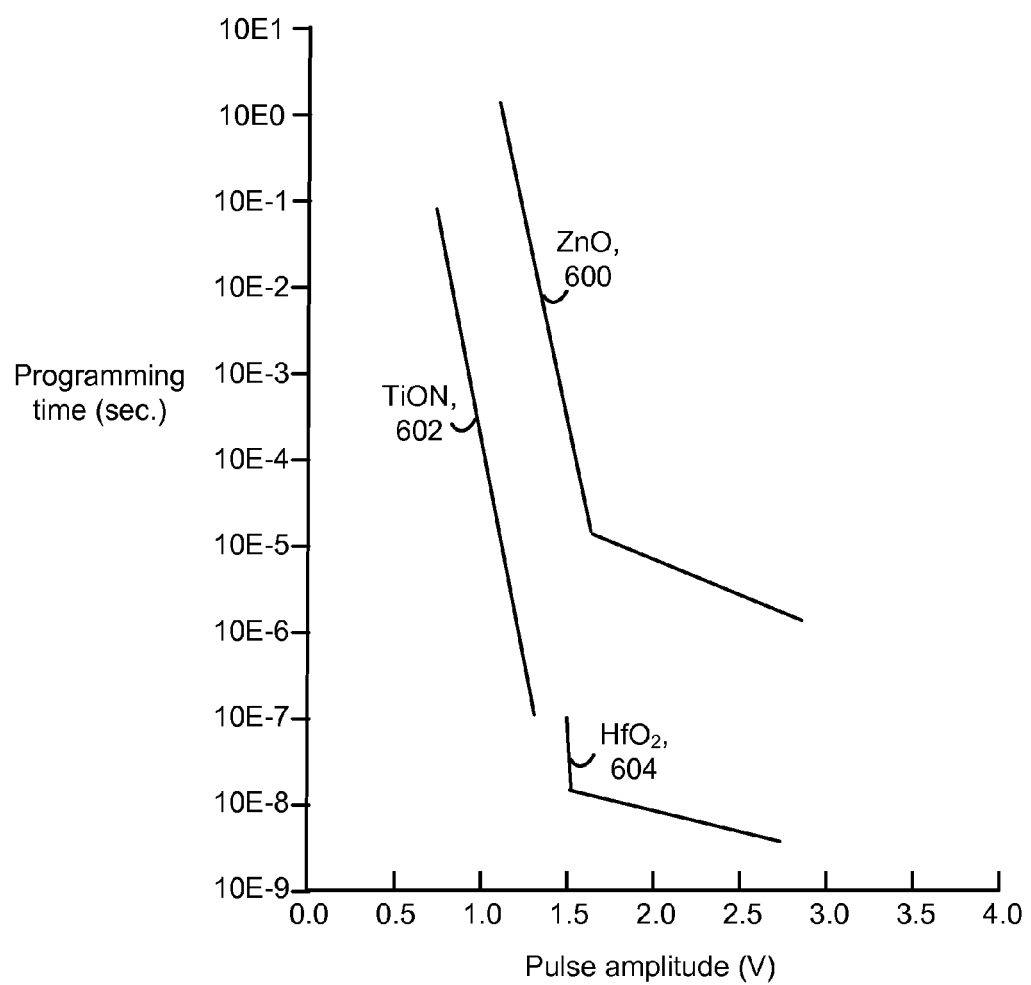
FIG. 6 depicts a graph of programming time versus pulse amplitude.

FIG. 6 depicts a graph of programming time versus pulse amplitude. As mentioned at the outset, a higher voltage can be applied to reduce the set time of a memory cell. Here, the x-axis depicts pulse amplitude in Volts, on a linear scale, and the y-axis depicts programming time in seconds, on a logarithmic scale, from $10^{-9}$ to $10^{1}$. Curve 600 provides data for a resistance-switching material of ZnO, curve 602 provides data for a resistance-switching material of TiON, and curve 604 provides data for a resistance-switching material of $HFO_2$. As can be seen, the programming time increases sharply at lower pulse amplitudes. Typically, in the set process, short program pulses are applied to a memory cell via a bit line. By using short pulses, the energy which is imprinted onto the memory cell can be limited. However, as the parasitic capacitance of the bit line goes into the stored energy of the bit lines ($E=\frac{1}{2} \times CV^2$) the energy which gets discharged into the memory cell increases dramatically when going to higher voltages. This leads to the fact, that the memory cell gets into a very low resistance state, where the required current for reset can be excessive.

Figure 7A:
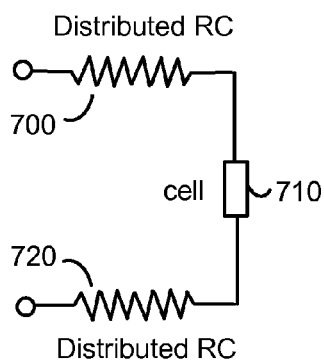
FIG. 7a depicts a circuit diagram of a memory cell in series with distributed resistances of a bit line and a word line.

FIG. 7a depicts a circuit diagram of a memory cell in series with distributed resistances of a bit line and a word line. In a memory array, the set process is affected by word lines and bit lines which have distributed resistance-capacitance (RC) values. For example, distributed capacitances 700 and 720 may be associated with a bit line and word line, respectively, which are connected to a memory cell 710. A bit line or word line is essentially a wire with a distributed resistance-capacitance.

During a switching event from the high resistance state to the low resistance state, the cell will draw a capacitive-discharge current from the environment adjacent to the cell. For example, programming may occur via the bit line so that the bit line discharges to the cell. This current can be kept low if the applied voltages are low. However, due to the exponential relationship between switching time and switching voltage, the voltage should be significantly over the threshold voltage of the cell to switch the cell in a reasonable time. Since the energy stored in a capacitor is $E=\frac{1}{2} \times CV^2$, where C is capacitance and V is voltage, the energy which is discharged into the cell will increase with the square of the voltage. For instance, a change from 2 V to 3 V increases the energy by a factor of five ($3^2$-$2^2$).

A substantial problem is therefore encountered in providing a fast write time while avoiding discharging too much energy into a memory cell and impairing the ability to reset the cell.

Figure 7B:
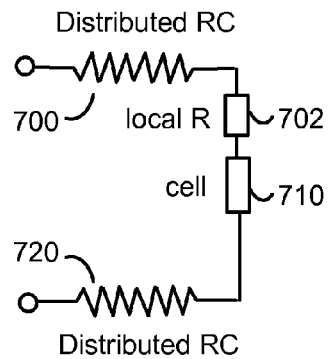
FIG. 7b depicts the circuit diagram of FIG. 7a modified to include a local contact resistance between the memory cell and the bit line.

FIG. 7b depicts the circuit diagram of FIG. 7a modified to include a local contact resistance between the memory cell and the bit line. One solution provides a localized resistance for the memory cell 710. A local resistor (R) 702 can be provided in the very local environment of the memory cell to decouple the memory cell from the surrounding capacitance of the bit line and/or word line. In this case, the effective voltage across the cell can be decreased immediately in case of any current flow. Generally, the local resistor should have a very small stray capacitance; that is, it should be very small in size. Further, the local resistor should be very close to the memory cell to minimize any capacitance energy which discharges across the memory cell. A contact resistance which is formed by the junction of a metal and a semiconductor, as detailed further below, is one possible implementation of the local resistor. Further, one or more local resistors can be provided on one or both sides of a memory cell. The resistance of the resistor can be tuned according to the needs of the memory device by adjusting a type of the metal which is used, the type of semiconductor material which is used, and a doping concentration of the semiconductor material. Contact resistances of different materials can be used to form local resistors. A contact resistance has the advantage of conducting the very high frequency switching event due to its serial capacitance, while providing a sufficient current limitation with little stray capacitance due its compact size. The capacitance is very low because the resistance is only defined in the interface or junction. As an example, if a material which provides the local contact resistance has a area of 25 $nm^2$, the capacitance may be in the attofarad (aF) range (where 1 attofarad=$1 \times 10^{-18}$ Farad (F)), which is essentially negligible.

Figure 7C:
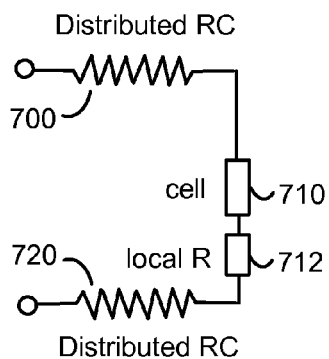
FIG. 7c depicts the circuit diagram of FIG. 7a modified to include a local contact resistance between the memory cell and the word line.

FIG. 7c depicts the circuit diagram of FIG. 7a modified to include a local contact resistance 712 between the memory cell and the word line.

Figure 7D:
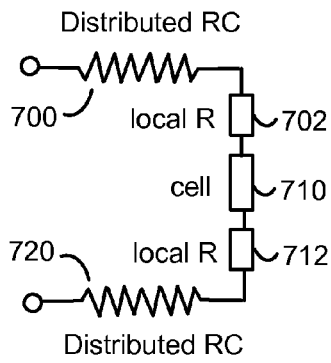
FIG. 7d depicts the circuit diagram of FIG. 7a modified to include a first local contact resistance between the memory cell and the bit line, and a second local contact resistance between the memory cell and the word line.

FIG. 7d depicts the circuit diagram of FIG. 7a modified to include a first local contact resistance 702 between the memory cell and the bit line, and a second local contact resistance 720 between the memory cell and the word line.

Figure 7E:
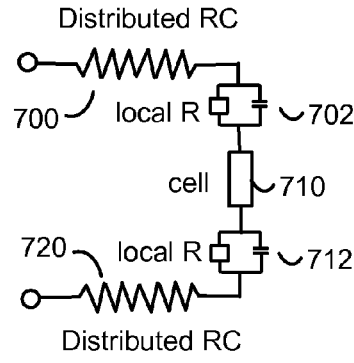
FIG. 7e depicts an equivalent circuit of the circuit of FIG. 7d.

FIG. 7e depicts an equivalent circuit diagram to FIG. 7d. Here, each local resistance can be represented by a resistor in parallel with a very small capacitance.

Figure 8A:
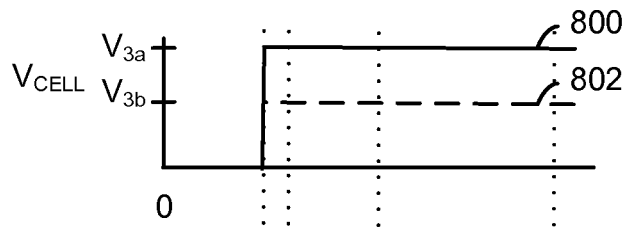

FIG. 8a depicts a cell voltage during the set process of FIG. 5a, based on the circuit of FIG. 7a. Each of FIGS. 8a-8e have a common time scale. The diagrams are not necessarily to scale. This example assumes no local contact resistance is provided. The x-axis represents time and the y-axis represents the voltage across the memory cell. Curve 800 indicates a faster programming which occurs when the voltage is relatively high ($V_{3a}$) and curve 802 indicates a slower programming which occurs when the voltage is relatively low ($V_{3b}$). At time t0, the voltage is stepped up and is maintained at the stepped up level during the set process and after the set occurs.

Figure 8B:
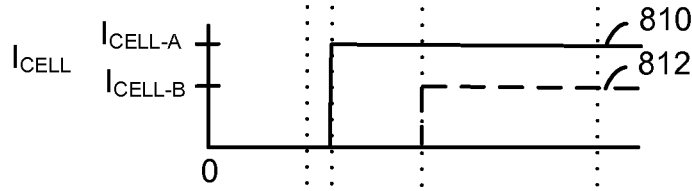

FIG. 8b depicts a cell current during the set process of FIG. 5a, based on the circuit of FIG. 7a. After a delay, from t0-t1, for the case with a higher amplitude voltage (curve 800), the set occurs at t1, where a current level of $I_{CELL-A}$ is reached. The delay is a soak time or threshold switching time, which is a time needed for the cell to react to the voltage. The switch time here may be 10 nsec., for instance. After a delay, from t0-t2, for the case with a lower amplitude voltage (curve 802), the set occurs at t2, where a current level of $I_{CELL-B}$ is reached. The switch time here may be 1 μsec., for instance.

Figure 8C:
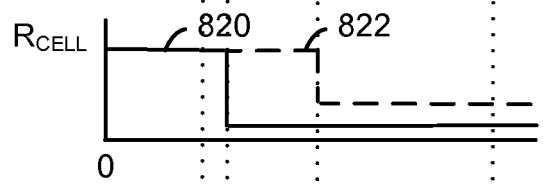

FIG. 8c depicts a cell resistance during the set process of FIG. 5a, based on the circuit of FIG. 7a. Curve 820 indicates that the resistance resets from high to low at t1 for the case with the higher amplitude voltage (curve 800). Curve 822 indicates that the resistance resets from high to low at t2 for the case with the lower amplitude voltage (curve 802). In general, the higher voltage switching will result in a lower on-resistance than the lower voltage switching.

Figure 8D:
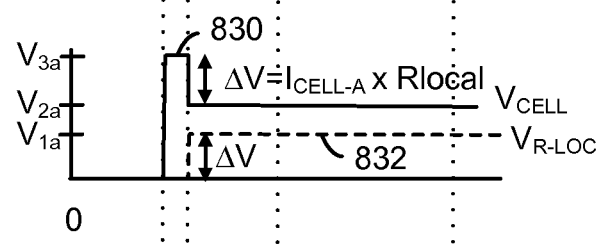

FIG. 8d depicts a cell voltage during the set process of FIG. 5a, based on the circuits of FIG. 7b-7e and based on a high amplitude programming voltage as depicted by waveform 800 in FIG. 8a. In contrast to FIG. 8a, where the voltage across the memory cell is maintained at a high level, curve 830 depicts the voltage across the cell when a local contact resistance is used. Initially, at t0, the voltage is stepped up to the level $V_{3a}$, as seen in curve 800. When the cell is set at t1, the voltage across the cell drops by $\Delta V=I_{CELL-A} \times Rlocal$ to a level $V_{2a}$. $\Delta V=V_{1a}=V_{3a}-V_{2a}$ is the voltage drop $V_{R-LOCAL}$ across the local resistance, depicted by curve 832. Essentially, $\Delta V$ is shifted from the cell to the local resistance. By lowering the voltage across the memory cell exactly after the switching event without further discharge of capacitances, difficulties in resetting the cell are reduced or avoided, while a fast switching time is also achieved.

Figure 8E:
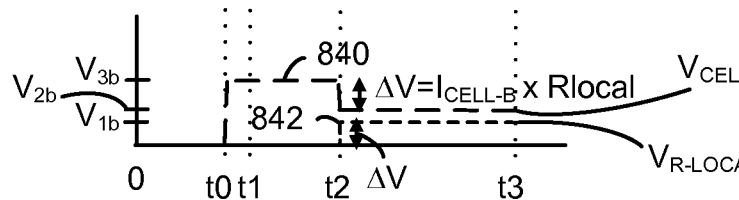

FIG. 8e depicts a cell voltage during the set process of FIG. 5a, based on the circuits of FIG. 7b-7e and based on a low amplitude programming voltage as depicted by waveform 802 in FIG. 8a. Also in contrast to FIG. 8a, curve 840 depicts the voltage across the cell when a local contact resistance is used. Initially, at t0, the voltage is stepped up to the level $V_{3b}$, as seen in curve 802. When the cell is set at t2, the voltage across the cell drops by $\Delta V=I_{CELL-B} \times Rlocal$ to a level $V_{2b}$. $\Delta V=V_{1b}=V_{3b}-V_{2}b$ is the voltage drop $V_{R-LOCAL}$ across the local resistance, as depicted by curve 842.

Figure 9A:
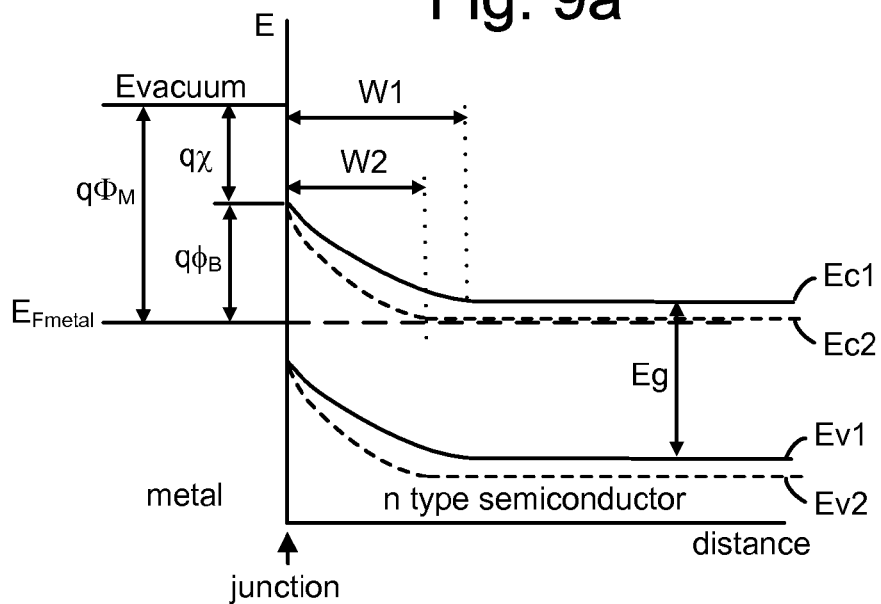
FIG. 9a depicts a band diagram for a junction between a metal and an n-type semiconductor, for use in forming a local contact resistance such as described in the circuits of FIGS. 7b-7e.

FIG. 9a depicts a band diagram for a junction between a metal and an n-type semiconductor, for use in forming a local contact resistance such as described in the circuits of FIGS. 7b-7e. One possible implementation for providing a local contact resistance is to specify a type of semiconductor material and doping level, and the type of the metal, to achieve a desired contact resistance at a junction between the semiconductor material and the metal. Advantageously, many metal-oxides (MeOx) such as $HfO_2$, $TiO_2$ or $ZrO_2$ have reasonable behavior on Si-surfaces and the resistance can be tuned in a wide range by varying the doping level of the silicon and by adjusting the type of metal which forms a Schottky barrier in this arrangement. A wide range of tuning is achieved since the contact resistance can be changed by orders of magnitude based on the doping level of the semiconductor.

In FIG. 9a, the horizontal axis indicates a distance from a metal-semiconductor junction, where the metal is on the left side of the junction and the semiconductor material is on the right side of the junction. The vertical axis indicates energy level. $E_{Fmetal}$ is the Fermi energy level of the metal, $E_{vacuum}$ is the energy level in a vacuum, and the difference between the two is $q \times \Phi_M$, where q is an electron charge (approximately $1.602 \times 10^{-19}$ coulombs), $\Phi_M$ is the work function of the metal, in Volts, and "x" denotes multiplication. For the semiconductor, Ec is the bottom of the conductive band and Ev is the top of the valence band. $q \times \phi_B$, is the difference between Ec at the junction, i.e., the conductive band edge, and $E_{Fmetal}$, where $\phi_B$ is the barrier height of the junction. The electron affinity of the semiconductor is $\chi$, and $q\chi$ is the difference between Ec prior to forming the junction and Evacuum, where $q\chi=q \times \phi_M - q \times \phi_B$. Eg is the energy gap between Ec and Ev. W1 is the barrier width with lower doping, corresponding to Ec1, and W2 is the barrier width with higher doping, corresponding to Ec2. The valence bands Ev1 and Ev2 correspond to Ec1 and Ec2, respectively.

Prior to forming the junction, the Fermi level of the n-type semiconductor is higher than the Fermi level of the metal. When the junction is formed, electrons in the n-type semiconductor lower their energy level by traversing the junction into the metal until thermal equilibrium, and a constant Fermi level through the structure, is reached. This creates a negative field which lowers the Ec and Ev band edges.

Generally, whenever a metal and a semiconductor are in intimate contact, a potential barrier exists between the two that prevents most charge carriers (electrons or holes) from passing from one to the other. Only a small number of carriers have enough energy to get over the barrier and cross to the other material. When a bias is applied to the junction, it can make the barrier appear lower or higher from the semiconductor side. The bias does not change the barrier height from the metal side. The barrier height is a property of the materials which are used. Moreover, doping of the semiconductor does not generally change the barrier height. However, doping can change the width of the barrier. More doping of the n-type semiconductor with donor impurities lowers Ec (from Ec1 to Ec2), thereby reducing the effective barrier width (from W1 to W2, where W1<W2) because charge carriers can tunnel through a thinner barrier, while less doping of the n-type semiconductor with donor impurities raises Ec, thereby increasing the barrier width (from W2 to W1). For example, when the semiconductor material is a Group IV (in the periodic table of elements) semiconductor such as silicon, n-type doping can be achieved using a Group V dopant.

The result of this configuration is a Schottky barrier or rectifying contact, where the junction conducts for one bias polarity, but not the other. In contrast, an ohmic contact conducts the same for both polarities, and is commonly used for passing signals into and out of a semiconductor device.

Figure 9B:
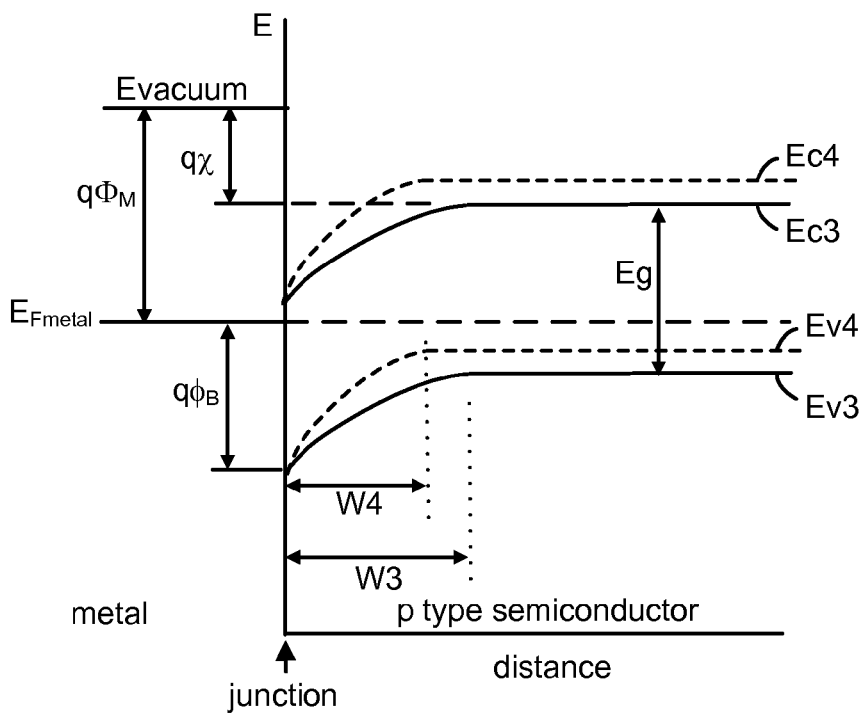
FIG. 9b depicts a band diagram for a junction between a metal and a p-type semiconductor, for use in forming a local contact resistance such as described in the circuits of FIGS. 7b-7e.

FIG. 9b depicts a band diagram for a junction between a metal and a p-type semiconductor, for use in forming a local contact resistance such as described in the circuits of FIGS. 7b-7e. In this case, $q \times \phi_B$ is the difference between Ev at the junction and $E_{Fmetal}$. More doping of the p-type semiconductor with acceptor impurities raises Ev (from Ev3 to Ev4), thereby reducing the barrier width from W3 to W4, where W4<W3, while less doping of the p-type semiconductor with acceptor impurities lowers Ev (from Ev4 to Ev3), thereby increasing the barrier width from W4 to W3. For example, when the semiconductor material is a Group IV semiconductor such as silicon, p-type doping can be achieved using a Group III dopant. W3 is the barrier width with lower doping, corresponding to Ev3, and W4 is the barrier width with higher doping, corresponding to Ev4. The conduction bands Ec3 and Ec4 correspond to Ev3 and Ev4, respectively.

FIG. 10a depicts a relationship between contact resistance and doping concentration for an n-type semiconductor, for different barrier heights, for use in forming a local contact resistance such as described in the circuits of FIGS. 7b-7e. As mentioned, the local contact resistance can be tuned in a wide range by varying the doping level of the silicon or other semiconductor material and by specifying the type of metal which forms the Schottky barrier. The x-axis indicates a doping concentration in atoms per cubic centimeter. The y-axis indicates the contact resistance in units of ohms per square centimeter, or $\Omega\text{-cm}^{-2}$. The graph provided is for n-type silicon with a <100> crystallographic orientation and is simplified and approximated. Further, the solid lines represent different values of $\phi_B$, which represents the barrier height. Lines for values of $\phi_B$=0.2, 0.3, 0.4, 0.5, 0.6, 0.7, 0.8, 0.9 and 1.0 are provided. Different metals have different Schottky barrier heights to a semiconductor material. Such graphs can be obtained from various sources in the art. Generally, for a selected semiconductor material and a selected metal, the barrier height is known from measurements, such as depicted in FIG. 10e.

From theory, for an n-type semiconductor, $\phi_B=\Phi_M-\chi$ and for a p-type semiconductor, $\phi_B$=Eg/q+$\chi$-$\Phi_M$. $\phi_B$ increases for metals with a higher work function which form a junction with silicon. In other cases, such as when the semiconductor material is Gallium Arsenide (GaAs), the barrier height is substantially independent of the metal. Moreover, barrier heights reported in the literature can vary due to factors such as cleaning procedure.

As mentioned, a wide range of tuning can be achieved since the contact resistance can be changed by orders of magnitude based on the doping level of the semiconductor. For example, an incremental change from a barrier height of 0.5 to 0.6 provides a large change in the resistance due to the exponential relationship. This provides a large tuning leverage.

FIG. 10b depicts a relationship between contact resistance and doping concentration for a p-type semiconductor, for different barrier heights, for use in forming a local contact resistance such as described in the circuits of FIGS. 7b-7e. The x-axis indicates a doping concentration in atoms per cubic centimeter. The y-axis indicates the contact resistance in units of $\Omega$-cm$^{-2}$. The graph provided is for p-type silicon with a <100> crystallographic orientation and is simplified and approximated. Further, the solid lines represent different values of $\phi_B$, which represents the barrier height. Lines for values of $\phi_B$=0.2, 0.3, 0.4, 0.5, 0.6, 0.7, 0.8, 0.9 and 1.0 are provided. Such graphs can be obtained from various sources in the art.

Regarding the graphs of FIGS. 10a and 10b, a graph can be used for the specific type of semiconductor material which is used. FIG. 10c depicts a table of example combinations of semiconductors and metals, arranged by n-type and p-type semiconductors. FIG. 10d depicts a table of metals and associated representative work functions. Note that the work function can change for crystalline elements based upon their orientation. Ranges for typical surfaces are shown. FIG. 10e depicts a table of example barrier heights for metals and associated semiconductors. FIG. 10f depicts a table of example electron affinities for semiconductors.

FIG. 11 depicts an example method for specifying a design of a memory device. Step 1100 includes specifying a resistance for a local contact resistance. This can be determined, e.g., based on the desired voltage which is to remain across the memory cell in the stead state set condition. For example, analysis from testing can determine a desirable range of voltages or current for a memory cell. With $\Delta V$ and the current Icell known, the resistance can be determined from R=$\Delta V$/Icell. For instance, in the example of FIG. 8d, the desired resistance is $(V_{3a}-V_{2a})/I_{CELL-A}$, and in the example of FIG. 8e, the desired resistance is $(V_{3b}-V_{2b})/I_{CELL-B}$. The resistance should be adjusted to the circuit demand, and not necessarily set as a highest or lowest resistance.

Step 1102 includes specifying a metal for the metal layer. Step 1104 includes specifying a semiconductor material. Step 1106 includes determining the barrier height $\phi_B$ based on the specified metal and the specified semiconductor material, such as indicated in FIG. 10e. In some cases, as mentioned, the barrier height $\phi_B$ may be substantially independent of the specified metal and therefore depend primarily on the specified semiconductor material.

Step 1108 includes determining a doping concentration of the specified semiconductor material based on the barrier height and the specified resistance. For example, for a selected metal of Al, and a selected semiconductor material of n-Si, we have $\phi_B$=0.7 eV from FIG. 10e. Note that $\phi_B$ and q×$\phi_B$ are used generally interchangeably herein to represent the barrier height. Assume a resistance per area Rc=10$^{-6}$ $\Omega$/cm$^2$. For instance, the contact area may 25 nm×25 nm=625 nm$^2$=6.25×10$^{-12}$ cm$^2$ and the desired resistance may be 160 k$\Omega$. From FIG. 10a, with Rc=10$^{-6}$ $\Omega$/cm$^2$ and $\phi_B$=0.7 eV, we have a doping concentration of approximately 2×10$^{20}$ atoms per cm$^3$. Note that the steps in FIG. 11 need not be performed separately and in the order shown. The general process of specifying the metal and semiconductor can be performed by the practitioner with consideration of known characteristics of various combinations of metals and semiconductors, as well a general knowledge of semiconductor physics and fabrication technologies.

Figure 12A:
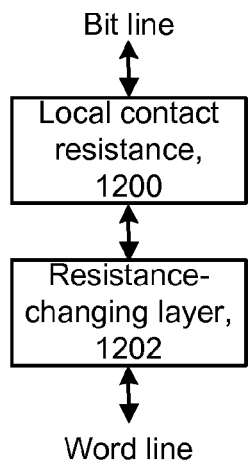
FIG. 12a depicts an example configuration of a memory device which includes a local contact resistance between the memory cell and the bit line, such as depicted by the circuit of FIG. 7b.

FIG. 12a depicts an example configuration of a memory device which includes a local contact resistance between the memory cell and the bit line, such as depicted by the circuit of FIG. 7b. In this example, a serial arrangement includes a bit line, local contact resistance 1200, resistance-changing layer 1202, and word line. Thus, the local contact resistance is between the bit line and the resistance-changing layer. An example fabrication process includes fabricating the resistance changing layer 1202 over a word line, and fabricating the local contact resistance 1200 over the resistance-changing layer 1202.

The local resistance is local to the resistance-changing layer, e.g., in the sense that it can be adjacent to the resistance-changing layer, or separated by fewer than a specified number of intermediate layers, or separated by less than a specified distance, and so forth. Or, the localness can indicate that there is no significant capacitance between the local resistance and the resistance-changing layer, or that the capacitance between the local resistance and the resistance-changing layer is less than a specified amount, for instance.

Figure 12B:
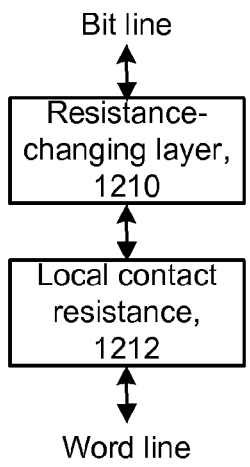
FIG. 12b depicts an example configuration of a memory device which includes a local contact resistance between the memory cell and the word line, such as depicted by the circuit of FIG. 7c.

FIG. 12b depicts an example configuration of a memory device which includes a local contact resistance between the memory cell and the word line, such as depicted by the circuit of FIG. 7c. In this example, a serial arrangement includes a bit line, resistance-changing layer 1210, local contact resistance 1212, and word line. Thus, the local contact resistance is between the word line and the resistance-changing layer. An example fabrication process includes fabricating the local contact resistance 1212 over a word line, and fabricating the resistance-changing layer 1210 over the local contact resistance 1212.

Figure 12C:
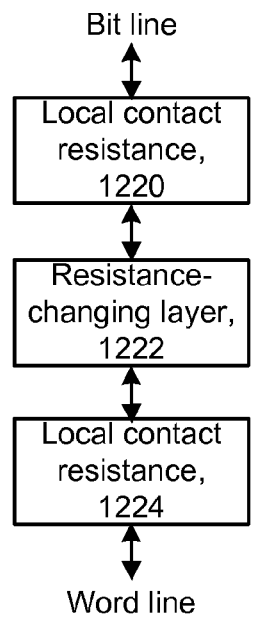
FIG. 12c depicts an example configuration of a memory device which includes a first local contact resistance between the memory cell and the bit line, and a second local contact resistance between the memory cell and the word line.

FIG. 12c depicts an example configuration of a memory device which includes a first local contact resistance between the memory cell and the bit line, and a second local contact resistance between the memory cell and the word line. In this example, a serial arrangement includes a bit line, a first local contact resistance 1220, a resistance-changing layer 1222, a second local contact resistance 1224, and a word line. As mentioned, one or more local contact resistances can be use on one or both sides of a resistance-changing layer of a memory cell. Each local contact resistance can be design according to the techniques provided herein. Moreover, the different local contact resistance can have the same or different resistance levels.

An example fabrication process includes fabricating the local contact resistance 1224 over a word line, fabricating the resistance-changing layer 1222 over the local contact resistance 1224, and fabricating the local contact resistance 1220 over the resistance-changing layer 1222.

Figure 12D:
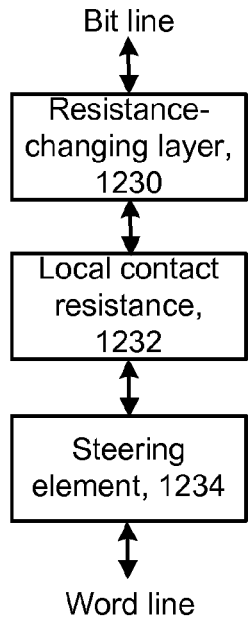
FIG. 12d depicts an example configuration of a memory device which includes a local contact resistance between a resistance-changing layer and a steering element.

FIG. 12d depicts an example configuration of a memory device which includes a local contact resistance between a resistance-changing layer and a steering element. In this example, a serial arrangement includes a bit line, a resistance-changing layer 1230, a local contact resistance 1232, a steering element 1234, and a word line. The steering element for a memory cell can be a diode, for instance. In this case, a local contact resistance is between the resistance-changing layer and the steering element.

An example fabrication process includes fabricating the steering element 1234 over a word line, fabricating the local contact resistance 1232 over the steering element 1234, and fabricating the resistance-changing layer 1230 over the local contact resistance 1232.

Figure 12E:
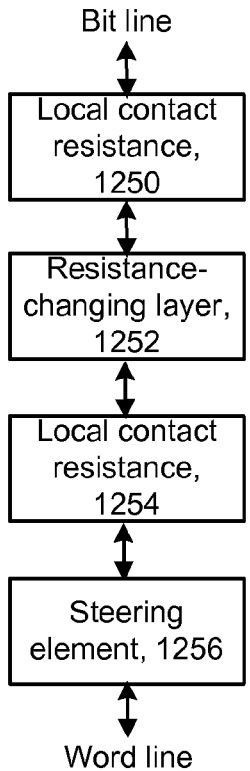
FIG. 12e depicts an example configuration of a memory device which includes local contact resistances on both sides of a resistance-changing layer, where one of the local contact resistances is between the resistance-changing layer and a steering element.

FIG. 12e depicts an example configuration of a memory device which includes local contact resistances on both sides of a resistance-changing layer, where one of the local contact resistances is between the resistance-changing layer and a steering element. In this example, a serial arrangement includes a bit line, a first local contact resistance 1250, a resistance-changing layer 1252, a second local contact resistance 1254, a steering element 1256, and a word line. In this case, a first local contact resistance is between the bit line and the resistance-changing layer, and a second local contact resistance is between the resistance-changing layer and the steering element.

An example fabrication process includes fabricating the steering element 1256 over a word line, fabricating the local contact resistance 1254 over the steering element 1256, fabricating the resistance-changing layer 1252 over the local contact resistance 1254, and fabricating the local contact resistance 1250 over the resistance-changing layer 1252.

Figure 12F:
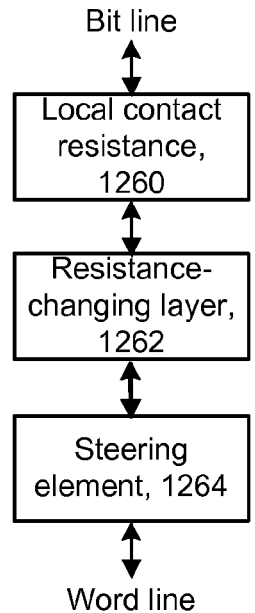
FIG. 12f depicts an example configuration of a memory device which includes a local contact resistance on one side of a resistance-changing layer, and a steering element on the other side of the resistance-changing layer.

FIG. 12f depicts an example configuration of a memory device which includes a local contact resistance on one side of a resistance-changing layer, and a steering element on the other side of the resistance-changing layer. In this example, a serial arrangement includes a bit line, a local contact resistance 1260, a resistance-changing layer 1262, a steering element 1264, and a word line. In this case, a local contact resistance is between the bit line and the resistance-changing layer, and a steering element is between the resistance-changing layer and the word line.

An example fabrication process includes fabricating the steering element 1264 over a word line, fabricating the resistance-changing layer 1262 over the steering element 1264, and fabricating the local contact resistance 1260 over the resistance-changing layer 1262.

Variations of the above-mentioned implementations are possible. The order of layers in each implementation can be reversed so that the word line is on top and the bit line is on the bottom, for instance. Moreover, one or more intermediate layers can be provided between each of the layers depicted. Also, the order of the steering element can be changed so that it is located above the other layers.

Figure 13A:
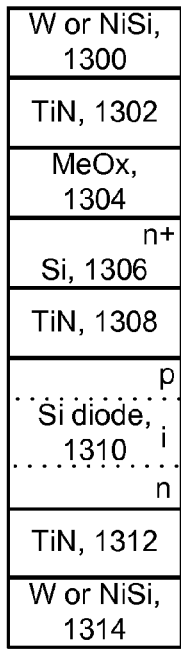
FIG. 13a depicts an example implementation of a layered memory device corresponding to FIG. 12d.

FIG. 13a depicts an example implementation of a layered memory device corresponding to FIG. 12d. The implementation includes a number of layers, each fabricated over the previous layer, including a W or NiSi layer 1314 connected to a word line, a TiN layer 1312, an Si diode 1310 having an n-type region 1313, an intrinsic (i) region 1311 and a p-type region 1309, a TiN layer 1308, an n+ type Si layer 1306, a MeOx layer 1304, a TiN layer 1302 and a W or NiSi layer 1300 connected to a bit line. A contact resistance is formed at the junction between the TiN layer 1308 and the highly-doped Si layer 1306.

Figure 13B:
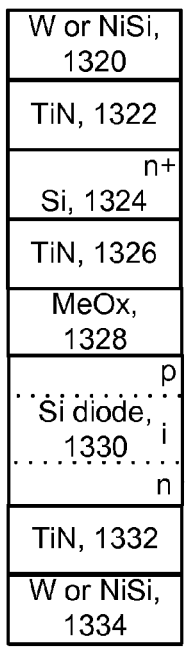
FIG. 13b depicts an example implementation of a layered memory device corresponding to FIG. 12f.

FIG. 13b depicts an example implementation of a layered memory device corresponding to FIG. 12f. The implementation includes a number of layers, each fabricated over the previous layer, including a W or NiSi layer 1334 connected to a word line, a TiN layer 1332, an Si diode 1330 having an n-type region 1333, an intrinsic (i) region 1331 and a p-type region 1329, a MeOx layer 1328, a TiN layer 1326, an n+Si layer 1324, a TiN layer 1322 and a W or NiSi layer 1320 connected to a bit line. Contact resistances are formed at the junction between the TiN layer 1326 and the highly-doped Si layer 1324, and at the junction between the TiN layer 1322 and the highly-doped Si layer 1324. In this case, the p-type region 1329 of the Si diode contacts the MeOx layer 1328, acting as an electrode.

Figure 13C:
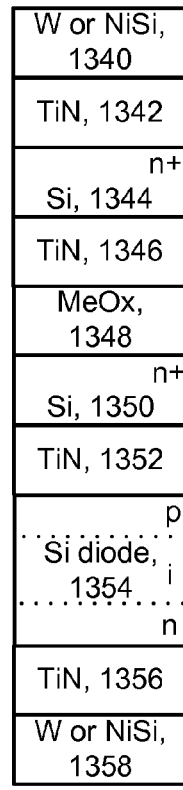
FIG. 13c depicts an example implementation of a layered memory device corresponding to FIG. 12e.

FIG. 13c depicts an example implementation of a layered memory device corresponding to FIG. 12e. The implementation includes a number of layers, each fabricated over the previous layer, including a W or NiSi layer 1358 connected to a word line, a TiN layer 1356, an Si diode 1354 having an n-type region 1357, an intrinsic (i) region 1355 and a p-type region 1353, a TiN layer 1352, an n+ type Si layer 1350, a MeOx layer 1348, a TiN layer 1346, another n+ Si layer 1344, a TiN layer 1342 and a W or NiSi layer 1340 connected to a bit line. Contact resistances are formed at the junction between the TiN layer 1352 and the highly-doped Si layer 1350, at the junction between the TiN layer 1346 and the highly-doped Si layer 1344, and at the junction between the TiN layer 1342 and the highly-doped Si layer 1344.

Figure 13D:
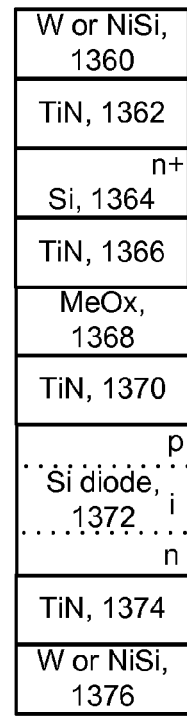
FIG. 13d depicts another example implementation of a layered memory device corresponding to FIG. 12e.

FIG. 13d depicts another example implementation of a layered memory device corresponding to FIG. 12e. The implementation includes a number of layers, each fabricated over the previous layer, including a W or NiSi layer 1376 connected to a word line, a TiN layer 1374, an Si diode 1372 having an n-type region 1375, an intrinsic (i) region 1373 and a p-type region 1371, a TiN layer 1370, a MeOx layer 1368, a TiN layer 1366, an n+ Si layer 1364, a TiN layer 1362 and a W or NiSi layer 1360 connected to a bit line. A contact resistance is formed at the junction between the TiN layer 1370 and the p-type region 1371 of the Si diode 1372, such that the p-type region 1371 acts as an electrode. Contact resistances are also formed at the junction between the TiN layer 1366 and the highly-doped Si layer 1364, and at the junction between the TiN layer 1362 and the highly-doped Si layer 1364. Here, the TiN layers 1366 and 1370 are both adjacent to the MeOx layer 1368, on opposing sides, and act as metal contacts to the MeOx layer 1368.

FIG. 13e depicts an example implementation of a layered memory device corresponding to FIG. 12f, where a punch-through diode is used as a steering element. The implementation is similar to that of FIG. 13b, except the Si diode 1380 is a punch-through diode which includes an n+ region 1383, p− region 1381 and n+ region 1379.

A punch-through diode allows bipolar operation of a cross-point memory array, and may have a symmetrical non-linear current/voltage relationship. The punch-through diode has a high current at high bias for selected cells and a low leakage current at low bias for unselected cells. Therefore, it is compatible with bipolar switching in cross-point memory arrays having resistive switching elements. The punch-through diode may be a N+/P−/N+ device or a P+/N−/P+ device. Generally, the punch-through diode 1380 includes two regions 1379 and 1383 that are heavily-doped with a material having a first type of conductivity, e.g., n type. A region 1381 is lightly-doped with a material having a second type of conductivity, e.g., p type. The punch-through diode 1380 is a N+/P−/N+ device.

In each FIGS. 13*a*-13*e*, note that the contact resistances are formed between a TiN layer and a highly doped Si layer. An example alternative to TiN is NiSi. Also, the contact resistance is between an n-type semiconductor and a metal layer, but it is possible to use a p-type semiconductor as well. FIG. 13*d* also has a contact resistance between a TiN layer and a p-type region of a n-Si diode.

While example implementations involving a memory cell having a diode as a steering element are provided, the techniques provided herein are generally applicable to other devices and steering elements, including a transistor, a punch-through transistor, a punch-through diode, a PN diode, NP diode, a PIN diode, an NPN diode, PNP diode, a Schottky diode, an MIN diode, a carbon silicone diode, a transistor layout and so forth. An example of a punch-through diode was provided in FIG. 13*e*.

Also, the resistance-changing element in the memory cell need not be a metal oxide. It can be a phase change cell, a carbon-based, a carbon nanotube-based, nano-ionic memory, conductive bridge, or a cell which changes its phase, spin, magnetic component, and so forth.

In one embodiment, a memory device includes a resistance-changing layer, and a local contact resistance in series with, and local to, the resistance-changing layer. The local contact resistance is established by a junction between a semiconductor layer and a metal layer, and the local contact resistance has a specified level of resistance according to a doping concentration of the semiconductor and a barrier height of the junction.

In another embodiment, a corresponding method for fabricating a memory device includes providing a resistance-changing layer, and providing a local contact resistance in series with, and local to, the resistance-changing layer, where the local contact resistance is established by a junction between a semiconductor layer and a metal layer, and the local contact resistance has a specified level of resistance according to a doping concentration of the semiconductor and a barrier height of the junction.

In another embodiment, a method for fabricating a memory device includes specifying a resistance for a local contact resistance, specifying a metal for a metal layer, specifying a semiconductor material for a semiconductor layer, determining a barrier height based on the selected metal and the selected semiconductor material, and determining a doping concentration of the specified semiconductor material based on the barrier height and the specified resistance.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A memory cell, comprising:
a resistance-changing layer;
a Silicon layer;
a metal layer in contact with the Silicon layer, wherein a junction between the Silicon layer and the metal layer forms a Schottky barrier, the junction provides a local contact resistance which has a specified level of resistance according to a doping concentration of the Silicon and a barrier height of the junction; and
a diode, the diode is a steering element for the memory cell, wherein the resistance-changing layer, the Silicon layer, the metal layer and the diode are connected in series.

2. The memory cell of claim 1, wherein:
the Silicon layer is adjacent to the resistance-changing layer.

3. The memory cell of claim 1, wherein:
the metal layer is adjacent to the resistance-changing layer.

4. The memory cell of claim 1, wherein:
the resistance-changing layer comprises a metal-oxide layer.

5. The memory cell of claim 1, further comprising:
first and second electrodes of the memory cell, wherein the first and second electrodes are connected in series with the resistance-changing layer, the Silicon layer, the metal layer and the diode.

6. The memory cell of claim 1, wherein:
the metal layer is adjacent to one side of the resistance-changing layer; and
the diode is adjacent to an opposing side of the resistance-changing layer.

7. The memory cell of claim 1, wherein:
the local contact resistance is between a bit line and the resistance-changing layer.

8. The memory cell of claim 1, wherein:
the local contact resistance is between a word line and the resistance-changing layer.

9. The memory cell of claim 1, wherein:
the local contact resistance is between a word line and the resistance-changing layer; and
the memory cell further comprises an additional local contact resistance between a bit line and the resistance-changing layer.

10. The memory cell of claim 1, wherein:
the memory cell is in a level of a monolithic three dimensional memory array.

11. The memory cell of claim 1, wherein:
the diode is a Silicon diode.

12. The memory cell of claim 11, wherein:
the Silicon diode comprises an intrinsic (i) region between an n-type region and a p-type region.

13. The memory cell of claim 11, wherein:
the Silicon diode comprises a p− region between an n+ region and another n+ region.

14. The memory cell of claim 1, wherein:
the Silicon layer comprises n+ Silicon.

15. A method for fabricating a memory cell, comprising:
providing a resistance-changing layer;
providing a Silicon layer;
providing a metal layer in contact with the Silicon layer, wherein a junction between the Silicon layer and the metal layer forms a Schottky barrier, the junction provides
a local contact resistance which has a specified level of resistance according to a doping concentration of the Silicon and a barrier height of the junction; and
providing a diode, the diode is a steering element for the memory cell, wherein the resistance-changing layer, the Silicon layer, the metal layer and the diode are connected in series.

16. The method of claim 15, wherein:
the Silicon layer is adjacent to the resistance-changing layer.

17. The method of claim 15, wherein:
the metal layer is adjacent to the resistance-changing layer.

18. The method of claim 15, wherein:
the resistance-changing layer comprises a metal-oxide layer.

19. The memory cell of claim 15, further comprising:
first and second electrodes of the memory cell, wherein the first and second electrodes are connected in series with the resistance-changing layer, the Silicon layer, the metal layer and the diode.

* * * * *